(12) United States Patent
Maloney et al.

(10) Patent No.: US 9,156,735 B2
(45) Date of Patent: Oct. 13, 2015

(54) HERMETIC SEALING OF GLASS PLATES

(75) Inventors: John J. Maloney, Solon, OH (US); Robert P. Blonski, North Royalton, OH (US); Chandrashekhar S. Khadilkar, Broadview Heights, OH (US); Srinivasan Sridharan, Strongsville, OH (US)

(73) Assignee: Ferro Corporation, Mayfield Heights, OH (US)

( * ) Notice: Subject to any disclaimer, the term of this patent is extended or adjusted under 35 U.S.C. 154(b) by 395 days.

(21) Appl. No.: 13/642,553

(22) PCT Filed: Apr. 27, 2011

(86) PCT No.: PCT/US2011/034101
§ 371 (c)(1),
(2), (4) Date: Dec. 28, 2012

(87) PCT Pub. No.: WO2011/139751
PCT Pub. Date: Nov. 10, 2011

(65) Prior Publication Data
US 2013/0111953 A1    May 9, 2013

Related U.S. Application Data

(60) Provisional application No. 61/328,258, filed on Apr. 27, 2010.

(51) Int. Cl.
*H01L 31/048* (2014.01)
*C03C 27/04* (2006.01)
*H01L 21/02* (2006.01)
*H01L 21/50* (2006.01)
*H01L 23/10* (2006.01)
*C03C 3/066* (2006.01)
*C03C 3/12* (2006.01)
*C03C 3/14* (2006.01)
*C03C 8/04* (2006.01)
*C03C 8/14* (2006.01)
*H01L 51/52* (2006.01)

(52) U.S. Cl.
CPC ............... *C03C 27/044* (2013.01); *C03C 3/066* (2013.01); *C03C 3/122* (2013.01); *C03C 3/14* (2013.01); *C03C 8/04* (2013.01); *C03C 8/14* (2013.01); *H01L 21/02345* (2013.01); *H01L 21/50* (2013.01); *H01L 23/10* (2013.01); *H01L 31/0481* (2013.01); *H01L 31/0488* (2013.01); *H01L 51/5246* (2013.01); *H01L 2924/0002* (2013.01); *H01L 2924/09701* (2013.01); *H01L 2924/12044* (2013.01); *Y02E 10/50* (2013.01)

(58) Field of Classification Search
CPC ................................. H01L 21/02345
See application file for complete search history.

(56) References Cited

U.S. PATENT DOCUMENTS

| | | |
|---|---|---|
| 5,106,663 A | 4/1992 | Box |
| 5,600,071 A | 2/1997 | Sooriakumar et al. |
| 2003/0193286 A1 | 10/2003 | Ottermann et al. |
| 2009/0107538 A1 | 4/2009 | Luch |
| 2010/0089444 A1 | 4/2010 | Thomsen et al. |

*Primary Examiner* — Cheung Lee
(74) *Attorney, Agent, or Firm* — Rankin, Hill & Clark LLP

(57) ABSTRACT

Durable hermetic seals between two inorganic substrates are produced using a high-intensity electromagnetic energy source, such as laser, to heat and seal enamel layers with controlled absorption of high-intensity energy source. Durable hermetic seals incorporating electrical feedthroughs are also produced.

17 Claims, 7 Drawing Sheets

Figure 1A:
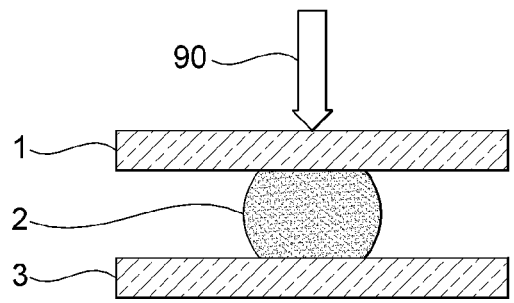

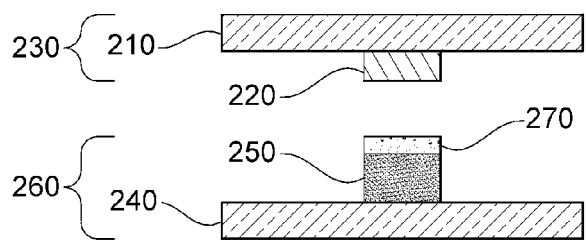 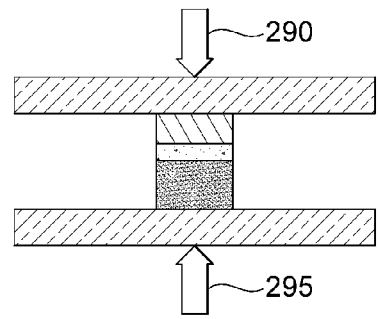
FIG.4A FIG.4B
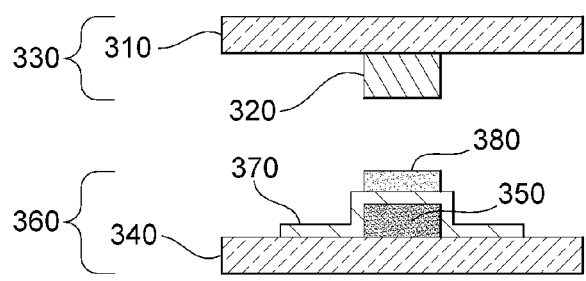 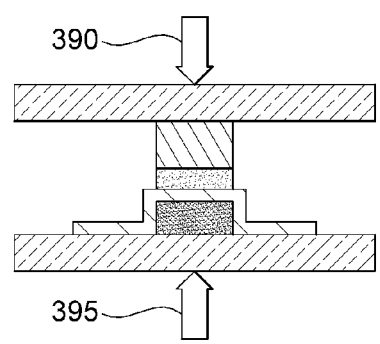
FIG.5A FIG.5B

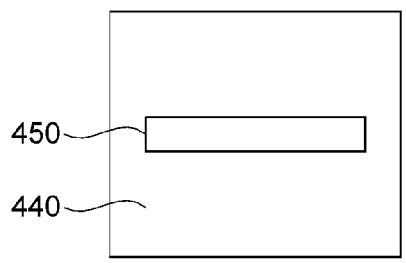
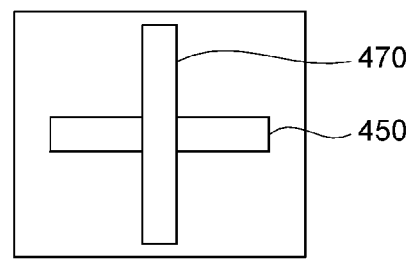
FIG.6A     FIG.6B
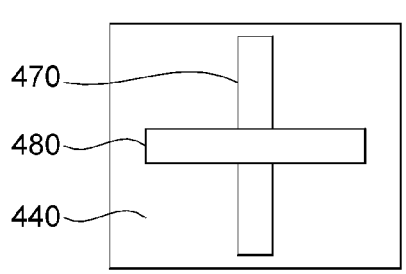
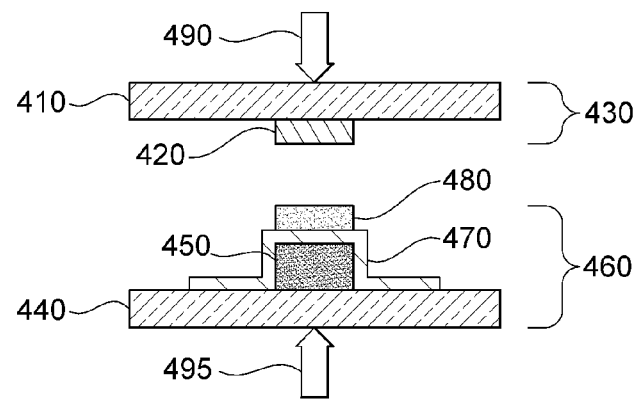
FIG.6C     FIG.6D

HERMETIC SEALING OF GLASS PLATES

BACKGROUND OF THE INVENTION

1. Field of Invention

The present invention relates to a frit-based hermetic sealing system for glass plates, seal materials, processes to apply these seal materials, seal designs for selective and controlled absorption of light to heat and seal the system. These hermetic seals are useful in various applications such as (a) encapsulating solar cells based on silicon, organic systems, and thin film, (b) encapsulating other electronic devices such as organic LEDs (OLED), and (c) architectural windows and automotive glass.

2. Description of Related Art

Laser sealing is a widely investigated selective sealing process. Conventional frit-based laser sealing process involves absorption of an Infra-Red (IR) laser light by an absorber such as pigment or colored frit in the seal system. Accordingly, the IR absorption (i.e., heating) occurs at the top interface—the interface between glass plate and the seal material. Owing to the thickness and mass of material to be heated, the amount of heat supplied must be relatively high. Conventional laser sealing processes involve absorption of IR radiation by an appropriate pigment or colored frit in the sealant material. Deposited seals are typically about 60% or less of their theoretical density before melting/sintering. Therefore, significant dimensional changes are to be expected during laser processing to form the seal (or any related localized energy deposition process). The process can be time consuming because such a large mass of material must be heated and is not trouble free. For example, conventional frit based laser sealing material includes an organic binder which can provide contamination within the sealed glass from combustion of the binder upon heating, large voids and bubbles that could reduce the strength of the seal. Since most of the heat is generated at the glass/seal material interface the process is more prone to cracking of seal and the glass plate. Similar such problems arise in other selective sealing processes where IR, visible or UV lights are used for sealing.

Accordingly, improvements in the art of selective sealing processes such as laser sealing are required.

BRIEF SUMMARY OF THE INVENTION

The present invention provides seal materials, process to apply seal materials, seal designs, geometries and process steps for making hermetic seals to protect electric and electronic circuits, as well as hermetic conductive feedthroughs for electrical contact across a seal, and simplifying the manufacture of these hermetic seals. These feedthroughs can be thick film or thin film trace, conductive electrode coatings on glass, ribbon materials or wires.

This invention also envision structures without these electrical feedthroughs for applications requiring vacuum or desired gas atmospheres inside these seal assemblies such as architectural windows. Broadly in selective sealing processes preferential absorption of electromagnetic waves of interest takes place due to the presence of suitable absorbers in the seal materials. This leads to selective heating of seals. Control of various aspects of this selective sealing process such as: amount and location of absorption and heat generation; controlling heat dissipation to minimize the occurrence of thermal gradients or thermal shock—through materials and seal designs, especially for one such selective sealing process—laser sealing, are other aspects of the invention.

The invention involves controlling the amount of electromagnetic radiation energy, the location of the deposition of this energy, and the rate of deposition of this energy, so that a high quality seal is formed, and so that fractures due to thermal shock and thermal expansion mismatches that would compromise the hermeticity of the seal are prevented or minimized.

The process for forming hermetic seals according to this invention is simple in concept, but quite difficult to achieve in practice. Note that the formation of a hermetic seal requires near perfection since even a single gap or leak in a large solar module, which may be on 0.8×1.2 m glass substrates, compromises the seal and lifetime of the module. It should also be appreciated that bubbles present in an enamel or that would form during the sealing operation will expand in size during the heating, forming larger voids by that could compromise the integrity of the seal.

In principle, this invention entails minimizing any dimensional changes, depositing the majority of the energy at the site of the interface to be sealed, and then minimizing any thermal gradients and expansion mismatches to minimize the chance for fractures from thermal shock or thermal expansion mismatch.

The dimensional changes are primarily eliminated by the use of fired (preglazed) enamels that have been densified/sintered from dried depositions having bulk densities of about 60% or less of their theoretical density, to fired enamels with at least 90% of theoretical density. However, it should also be recognized that bonding a substrate having a preglazed enamel to one with a thin layer of dried enamel paste would give only minor dimensional changes and would work nearly as well, and is also part of this invention.

Another purpose of the preglazed fired enamels on substrates is to create high-quality enamel-substrate interfaces. In addition, the preglazed fires are designed with a slower, annealing cool-down to provide low-stress enamel-substrate interfaces. In the case of the double enamel seal, the system is designed to create the highest temperature at the top-enamel/bottom enamel interface to enable formation of the seal, and have a minimal effect at both enamel/substrate interfaces so as not to perturb these annealed interfaces.

The second part of this invention concerns controlling the location of energy deposition. This can be well controlled by the use of transparent, semi-transparent, and opaque enamels, where transparent, semi-transparent, and opaque regard their properties with respect to the specific bands of electromagnetic radiation being used. The development of this invention created seals with several different wavelengths of IR-lasers and visible light. A critical factor is that the absorber (or absorbers) be chosen for the specific type of electromagnetic radiation being used, and that the substrate is a weak absorber of the specific radiation source. A second factor is that the radiation needs to be intense enough to enable the interface to reach its sealing temperature. So long as these requirements are met, the radiation can be of a single wavelength, broadband, or a combination of the two, and may be in the NIR (near infra-red, 700-2500 nm), visible, or ultraviolet region of the electromagnetic spectrum. In general, this technique can be referred to as a localized heating approach.

The third part of this invention relates to preventing stresses that would weaken the seal and preventing fractures that would compromise the hermeticity of the seal. This is done by controlling the composition of the enamel and the parameters of the sealing technique. Although it is not a requirement for the use of this invention, the use of preglazed enamels is extremely helpful for forming high-quality hermetic seals. The use of dried enamels for the sealing step results in significant dimensional changes when the coating has a substantial thickness, making formation of the seal more difficult. In addition, the dried enamels are prone to form large voids in the seal, and also tend to blow some contamination to the inside of the cell module during the sealing process. Dried enamels tested in this project did produce some bonded substrates. Broadly, a process of laser sealing begins with prefiring an IR-semi (or fully) transparent enamel composition on a top glass plate. An enamel that absorbs electromagnetic (EM) energy such as IR energy, (e.g., pigmented) is then prefired to a bottom glass plate. Then a laser is fired through the top glass plate to melt the top surface of the IR absorbing enamel and bond the pieces together. The enamels on both top and bottom plates can be single or multiple layers to tailor the selective absorption of laser light. In this case, the enamels, which are more hermetic than the organic adhesive, forms the majority of the seal. Additionally, the enamels serve as spacers for the substrates so that the cell components are not damaged within the seal.

Alternately, IR-semi transparent enamels are prefired to each of top and bottom glass plates, and a portion of IR-absorbing enamel is applied to one of the IR-transparent enamel prefires. A laser is fired through the top substrate and through the upper IR-absorbing material to fuse the portion of IR-absorbing enamel, and thereby complete the seal.

Prefiring eliminates the need to process a large mass of sealing material in a solar cell fabrication facility, and prevents excess heating of the photovoltaic device. For the final sealing fire, contamination from binder burnout is eliminated, as no organic binder is needed. In the aggregate, the sealing process carried out by the procedures outlined herein is faster than conventional processes, largely because the prefiring reduces the mass of frit that must be fired at the moment of seal formation.

As an alternative to the central IR-absorbing layer interposed between two IR-transparent layers (above), a thin layer of a conventional organic adhesive may be used. Such binder is subjected to an ultrasonic horn to effectuate binding or a UV light cured. Because no firing is then needed, contamination from the organic adhesive presents no problem, as combustion does not occur.

Although prefired enamel layers before laser sealing is preferred, it is also envisioned that direct sealing without prefiring is possible.

Similarly it is envisioned that sealing materials (enamel layers) can all be applied to the same plate (top or bottom) and selectively sealed to the other plate with or without prefiring the enamel. For the faster manufacturing it is preferred to have the enamels on the bottom plate and apply no enamel to the top plate to achieve maximum irradiated laser energy to the enamels on the bottom plate where it is desired.

An embodiment of the invention is a process of hermetically sealing a conductive feed through comprising: (a) applying to a first substrate a first enamel trace parallel to the substrate edge, (b) applying a second enamel trace which contains a conductor across the first enamel trace such that it contacts the first substrate in the area adjacent both edges of the first enamel, (c) applying a third enamel trace parallel to the substrate edge substantially over the first enamel trace, and (d) heating the respective enamels.

An embodiment of the invention is a process of sealing two inorganic substrates together using a high-intensity electromagnetic electromagnetic energy source comprising: (a) providing first and second inorganic substrates; and (b) providing an enamel layer having graduated EM absorption situated between the first and second substrates such that at least 40% of EM energy incident on the enamel layer is absorbed by a portion of the layer not immediately adjacent to the substrates.

Another embodiment of the invention is a sealant material system for use in joining two or more inorganic substrates that are used to form a photovoltaic device, said sealant material system comprising one or more glass or ceramic components. The sealant material system may include any glass and/or metal and/or oxide in any combination, disclosed herein.

An embodiment of the invention is a sealant material system for use in joining two or more inorganic substrates contained in a photovoltaic device upon application of a concentrated energy source. The sealant material system may include any glass and/or metal and/or oxide in any combination, disclosed herein.

An embodiment of the invention is a multi-cell solar array comprising a plurality of individually hermetically sealed solar cells. The sealing may be effectuated through proper application and heating of any glass and/or metal and/or oxide in any combination, disclosed herein.

Yet another embodiment of the invention is a process of hermetically sealing a conductive feed through comprising: (a) applying to a first inorganic substrate a first, substantially EM-absorber-free, glass-based sealant, (b) applying to a second inorganic substrate a second, substantially EM-absorber-free, glass-based sealant, (c) applying to at least one of the first and second inorganic substrates, over the substantially EM-absorber-free, glass based sealant, a composition including a conductive metal, (d) heating to sinter the respective sealants and enamels such that each fuses to its respective substrate, forming respective sintered sealants and enamels, (e) applying to at least one of the sintered enamel compositions an unfired soft enamel composition different from the first and second sealants, (g) positioning the first and second substrates such that the unfired soft enamel composition acts as a bridge between the first and second substrates, and (h) heating to sinter the soft enamel composition such that the first and second sintered enamel compositions are joined together.

A process of forming a photovoltaic device comprising two inorganic substrates comprising the steps of: (a) applying a sealant to at least one of the substrates; (b) aligning the substrates together; and (c) directing a concentrated energy source at the sealant so as to form a seal between at least a portion of the two substrates.

An embodiment involves a sealant material system for use in joining two or more inorganic substrates that are used to form a photovoltaic device, said sealant material system comprising one or more glass or ceramic components.

An embodiment of the invention is a sealant material system for use in joining two or more inorganic substrates contained in a photovoltaic device upon application of a concentrated energy source.

An embodiment of the invention is a multi-cell solar array comprising a plurality of individually hermetically sealed solar cells.

BRIEF DESCRIPTION OF THE INVENTION

Figure 1B:
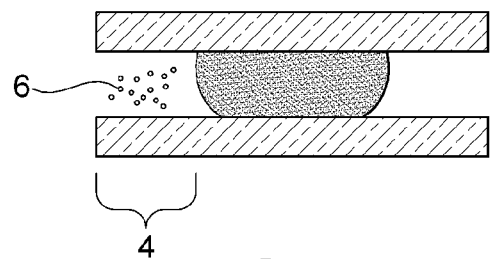
Figure 2A:
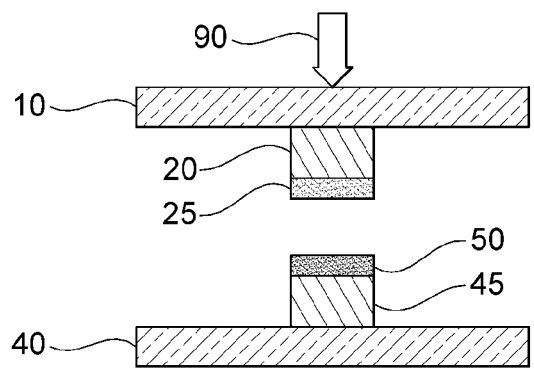
Figure 2B:
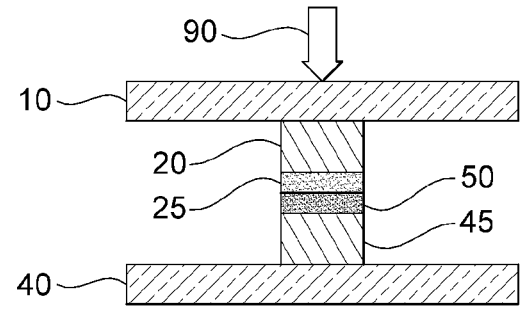

FIG. 1 depicts the prior art.
FIG. 2 schematically depicts formation of a hermetic seal of the invention.
FIG. 3 schematically depicts formation of a hermetic seal of the invention.
FIG. 4 schematically depicts formation of a hermetic seal of the invention.

FIG. 5 schematically depicts a hermetically sealed electrical feedthrough.

FIG. 6 schematically depicts a sequence of steps to form an integral feedthrough.

FIG. 7 schematically depicts an embodiment of the invention with the energy source located at the side of the plates.

Figure 8:
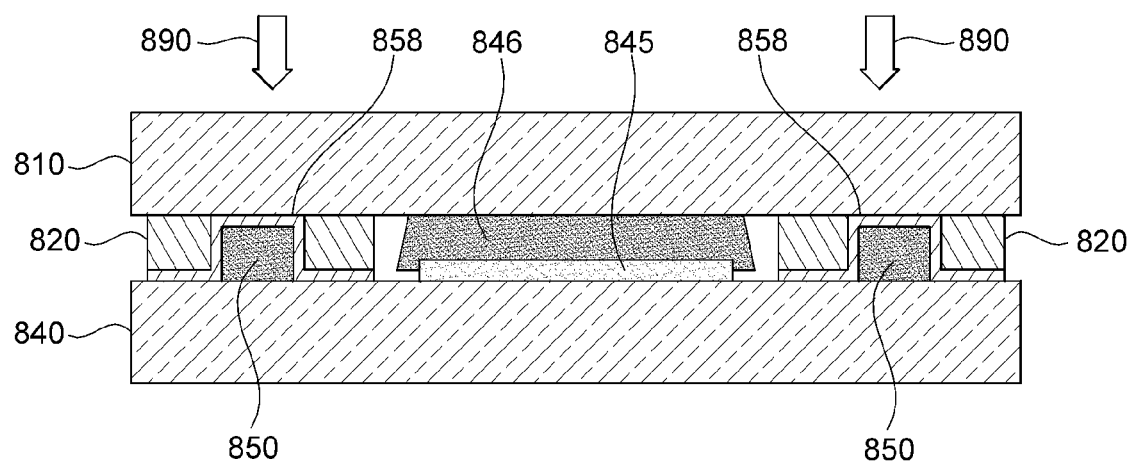

FIG. 8 schematically depicts an embodiment of the invention where a substrate has a recess to engulf an enamel layer.

DETAILED DESCRIPTION OF THE INVENTION

In conventional furnace sealing, heat from an oven or visible light source is used to fuse the glass in a seal. If, for example the desired set point temperature is 500° C., the temperature precision may be as close as ±10 to 20° C., with minor, if any, temperature gradients. The temperature homogeneity within the fired article can also be maintained at ±10 to 20° C. This process is slow, with heating to fusion requiring perhaps 10 minutes to an hour.

In the prior art conventional laser sealing process, laser IR energy 90 is absorbed by a an absorber such as a pigment or colored frit, each within an enamel sealant. As shown in FIG. 1 (prior art), IR absorption (heating) occurs mainly at the top interface, where the top substrate 1 meets the seal material 2. A relatively high level of heating is needed to fuse the entire mass of sealant 2 and especially to ensure a good seal at the interface between the lower substrate 3 (glass or metal) and the mass of enamel sealant. The high level of heating required can lead to a slow manufacturing cycle (long process times). As shown in FIG. 1B, the use of a conventional organic binder (vehicle) can lead to contamination 6 of the electric device internal (4) to the seal 2 due to combustion. Further combustion of the binder during the sealing process, leads to large voids and bubbles that could reduce the strength of the seal. Since most of the heat is generated at the glass/seal material interface the process is more prone to cracking of seal and the glass plate. Similar such problems arise in other selective sealing processes where IR, visible or UV lights are used for sealing.

In the laser sealing process of the prior art as well as in the current invention, there is less temperature control, homogeneity, where, if, for example the desired set point temperature is 500° C., the temperature precision may be as close as ±100° C., with very large temperature gradients. The temperature homogeneity within the fired article can range from +100° C. from the set point to −400° C. from the set point. Therefore the material system and the seal design has to be more forgiving to these wide temperature variations. The benefit of the current inventive laser sealing process of the invention is that selective heating is sufficient to cause enough of glass fusion to effect the sealing which is extremely fast, requiring as little as one millisecond ($10^{-3}$ sec).

An embodiment of the invention is a process of hermetically sealing a conductive feed through comprising: (a) applying to a first substrate a first enamel trace parallel to the substrate edge, (b) applying a second enamel trace which contains a conductor across the first enamel trace such that it contacts the first substrate in the area adjacent both edges of the first enamel, (c) applying a third enamel trace parallel to the substrate edge substantially over the first enamel trace, and (d) heating the respective enamels. Each enamel trace may be heated individually. The heating of the enamels may occur in any order, sequentially or simultaneously. If the enamels include organic components, heating may be used to remove at least a portion of the organic components. Preferably, the heating will fully sinter the enamel layers. In a preferred embodiment, at least one of the enamel layers contains at least one of an IR-transparent enamel, IR-semi-transparent enamel, IR-absorbing enamel, a visible light transparent enamel, a visible light semi-transparent enamel, and a visible light-absorbing enamel. In an alternate embodiment, the conductive feed through is part of the glass substrate itself and only the third enamel trace alone is applied over the conductive feed through and the first enamel trace is not applied.

An embodiment of the invention is a process of sealing two inorganic substrates together using a high-intensity electromagnetic energy source comprising: (a) providing first and second inorganic substrates; and (b) providing an enamel layer having graduated EM absorption situated between the first and second substrates such that at least 40% of EM energy incident on the enamel layer is absorbed by a portion of the layer not immediately adjacent to the substrates.

The enamel layer may include at least one first sublayer and at least one second sublayer, wherein the at least one first sublayer has a higher EM absorbance than the at least one second sublayer, wherein the at least one second sublayer is adjacent to a substrate and the at least one first sublayer is not adjacent to a substrate, and wherein at least 40% of EM energy incident on the sublayers is absorbed by the at least one first sublayer. At least one of the sublayers may not absorb infrared energy. In an alternate embodiment, the absorption of incident EM energy occurs at the predominantly in the first sublayer or in the interface between the sublayers. In such embodiment the second sublayer does not substantially absorb EM energy, meaning it absorbs less than 20% of incident EM energy.

There may be present a multiplicity of first and second sublayers such that the infrared absorption of the enamels therein are graduated from low to high through the enamel layer. Prior to heating, the enamel layers may be all only on the top substrate or only on the bottom substrate. Alternately, only one enamel layer may be on each of the top and bottom substrates. Alternately, there may be only a single enamel layer between top and bottom substrate.

The enamel layers are heated prior to sealing. The heating may remove any organic components between the layers or sublayers. Preferably, the heating fully sinters the enamel layers. The electromagnetic energy source is a may be a broad band infrared source, a laser, a flame, or other energy sources. The high-energy electromagnetic radiation source is a source selected from the group consisting of broadband visible, broadband infrared, laser, visible light, microwave. The EM radiation source may be multiple types including predominantly one with a minor portion of another. The high-energy electromagnetic radiation source may have a wavelength of 250 nanometers to 2500 nanometers.

The seal structure formed hereby may include a conductive feed through, incorporated in the seal structure. The conductive feed through may be part of or through the top or bottom substrate itself. The conductive feed through may be a conductive coating such as ITO on a glass substrate. The conductive feedthrough may form the electrode of the photovoltaic device.

An embodiment of the invention is a multi-cell solar array comprising a plurality of individually hermetically sealed solar cells. The sealing may be effectuated through proper application and heating of any glass and/or metal and/or oxide in any combination, disclosed herein.

Yet another embodiment of the invention is a process of hermetically sealing a conductive feed through comprising: (a) applying to a first inorganic substrate a first, substantially EM-absorber-free, glass-based sealant, (b) applying to a second inorganic substrate a second, substantially EM-absorberfree, glass-based sealant, (c) applying to at least one of the first and second inorganic substrates, over the substantially EM-absorber-free, glass based sealant, a composition including a conductive metal, (d) heating to sinter the respective sealants and enamels such that each fuses to its respective substrate, forming respective sintered sealants and enamels, (e) applying to at least one of the sintered enamel compositions an unfired soft enamel composition different from the first and second sealants, (g) positioning the first and second substrates such that the unfired soft enamel composition acts as a bridge between the first and second substrates, and (h) heating to sinter the soft enamel composition such that the first and second sintered enamel compositions are joined together.

A process of forming a photovoltaic device comprising two inorganic substrates comprising the steps of: (a) applying a sealant to at least one of the substrates; (b) aligning the substrates together; and (c) directing a concentrated energy source at the sealant so as to form a seal between at least a portion of the two substrates. The assembly may encapsulate a photovoltaic device; be a photovoltaic device, be or include double-paned or multi-paned architectural windows; be or encapsulate an LED or OLED.

An embodiment involves a sealant material system for use in joining two or more inorganic substrates that are used to form a photovoltaic device, said sealant material system comprising one or more glass or ceramic components.

An embodiment of the invention is a sealant material system for use in joining two or more inorganic substrates contained in a photovoltaic device upon application of a concentrated energy source.

An embodiment of the invention is a multi-cell solar array comprising a plurality of individually hermetically sealed solar cells.

An embodiment of the invention includes a hermetic seal. In the general seal design that achieves hermeticity, which forms the heart of the invention, as shown in FIG. 2, enamels are prefixed onto the substrates to enable formation of dense, void-free glass layers and to prevent binder burn-out issues. In particular, a top glass substrate 10 is printed with a transparent enamel buffer layer 20 and semitransparent absorbing layer 25. A bottom glass substrate 40 is printed with an enamel buffer layer 45 (which may have the same constitution as layer 20) and a high-absorbance (largely opaque to the wavelengths of electromagnetic radiation used for heating/curing) enamel layer 50. Ideally, the semi-transparent layer 25 and the top of the high-absorbance layer 50 will heat and fuse. The top buffer layer and the bottom of the high-absorbance layer will buffer the heat flow, preventing large thermal gradients from forming at the substrate interfaces. The buffer layer properties can be designed to be different from the semi-transparent to opaque enamel layers to achieve the overall good sealing of the assembly as envisioned in this invention. The top glass sheet is positioned over the bottom sheet. As pressure is applied to hold the top and bottom sheets together, an IR-laser 90 is fired through the top substrate to sinter and fuse the enamel traces together. A hermetic seal is thus formed between the top and bottom sheets of glass.

By skillful variations and control of the amount of location of heat generation in the enamel layers during sealing, tailoring the flow of generated heat to minimize thermal gradients and thermal shock, the sequence of enamel layers in FIG. 2 can be varied to give different modifications. Variations of number (1, 2 or more enamel layers for each substrate); placement (such as all on bottom substrate and none on top substrate) of enamel layers; and firing (such as elimination of prefiring before sealing) are envisioned as described later in FIGS. 3 and 4.

An embodiment of the invention is a process for producing a hermetically sealed (electrical) feedthrough. As shown in FIG. 5, a first IR-absorbing enamel trace (a paste) is printed on a glass or other firable inorganic substrate such as metal, ceramics, or silicon, (which will be called the bottom sheet). A conductive enamel is printed atop the first IR-absorbing enamel. A second IR-absorbing enamel trace is printed over the conductive enamel. The first and second enamel traces may be printed parallel or coextensively with one another, and at right angles to the conductive enamel. A top glass sheet or other inorganic substrate is positioned over the bottom sheet. As pressure is applied to hold the top and bottom sheets together, with the first, second, and conductive enamel traces therebetween, an IR-laser is fired through the top substrate to sinter and fuse the first, second and conductive traces. A hermetic seal is thus formed between the top and bottom sheets of glass. The second enamel trace may also contain a conductor is a strip or wire or ribbon of a conductive material.

An embodiment of the invention involves localized energy deposition in order to sinter and flow a sealing glass in order to form a hermetic seal. Such localized energy deposition may include infrared heating, laser sealing, visible and/or IR light lamp sealing, and even curing of adhesive sealant between top and bottom substrate by UV light or ultrasonically heating the adhesive, disclosed elsewhere herein. The inventors have discovered that controlling the location and amount of heat generation for the particular wave lengths of electromagnetic radiation from the heating source and incorporation of suitable absorbers in the enamel layers and the seal designs are key.

An embodiment of the invention involves encapsulating a solar cell, or a plurality thereof, which can be fabricated into modules, and sealed together with the structures and processes disclosed herein. Solar cells are generally made of semiconductor materials, such as silicon (Si), which convert sunlight into useful electrical energy. A solar cell contact is in generally made of thin wafers of Si in which the required PN junction is formed by diffusing phosphorus (P) from a suitable phosphorus source into a P-type Si wafer. The side of the silicon wafer on which sunlight is incident is generally coated with an anti-reflective coating (ARC) to prevent reflective loss of sunlight. This ARC increases the solar cell efficiency. A two dimensional electrode grid pattern known as a front contact makes a connection to the N-side of silicon, and a coating of predominantly aluminum (Al) makes connection to the P-side of the silicon (back contact). Further, contacts known as silver rear contacts, made out of silver or silver-aluminum paste are printed and fired on the N-side of silicon to enable soldering of tabs that electrically connect one cell to the next in a solar cell module. These contacts are the electrical outlets from the PN junction to the outside load. Further details on the composition and fabrication of solar cells can be found in commonly owned U.S. Pat. App. Pub. Nos. 2006/0102228; 2006/0289055 and 2009/0056798, all of which are incorporated by reference in their entireties.

Other embodiments of this invention can provide a sealed cavity to encapsulate different display electronics such as LEDs, OLEDS for localized heating and sealing without unduly heating the electronics inside. Yet other embodiments involve providing a hermetic seal between glass plates to hold vacuum or certain gas atmospheres for building windows.

Keeping in mind that, largely, like features in alternative embodiments have numbers separated by 100s, an embodiment of the invention depicted in FIG. 3, in particular FIG.

Figure 3A:
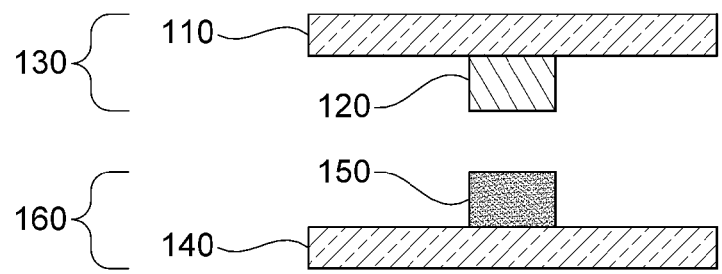
Figure 3B:
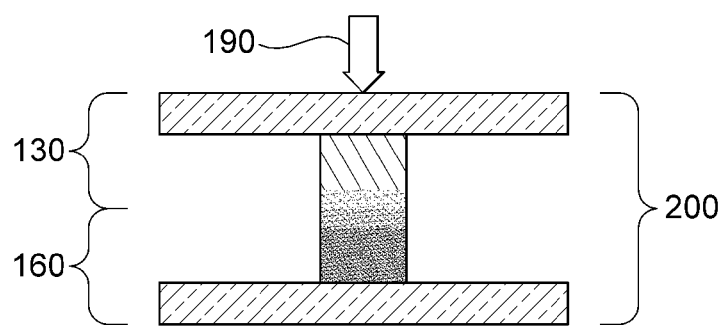

3A, involves applying to a first substrate 110 a first, semi-transparent or transparent enamel based sealant 120 to form top assembly 130. To a second substrate 140 is applied an opaque or highly absorbing (IR absorbing for laser sealing) enamel sealant 150 to form bottom assembly 160. Substrate 110 may be called the "top" substrate and substrate 140 may be called the "bottom" substrate. Top assembly 130 and bottom assembly 160 are pre-fired (separately or in one step) to form pre-fired top assembly 130 and pre-fired bottom assembly 160. Enamels 120 and 150 may contain conventional organic binders because such are fired normally, and combusted organic residue may escape. It is believed that, with further refinement of the concepts in herein, both the bottom substrate enamel buffer layer 45 in FIG. 2 and the transparent layer 20 (and corresponding layers in other figures) on the top substrate can be eliminated. In FIG. 3B, pre-fired top assembly 130 and bottom assembly 160 are physically joined such that fired enamel 120 and fired enamel 150 are in physical contact. Next, laser beam 190 is fired through top assembly 130 to fuse top enamel 120 and bottom enamel 150 to form a hermetic seal, thereby forming hermetically sealed device 200.

Figure 3C:
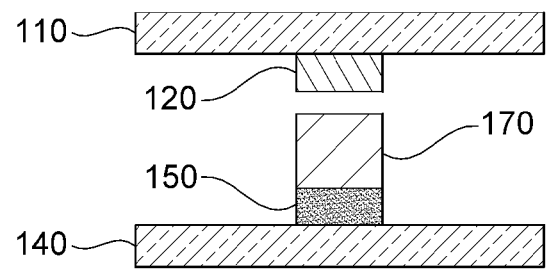

FIG. 3C shows an alternative embodiment, where a thin layer of unfired soft frit 170 is applied of the top of fired absorber-bearing frit. This layer of unfired soft frit 170 absorbs a portion of the laser energy 190. This can be advantageous if extremely precise processing conditions are needed and/or to minimize temperature gradients within the fired assemblies. Physical pressure can be applied to assist the joining of pre-fired assemblies 130 and 160.

Figure 3D:
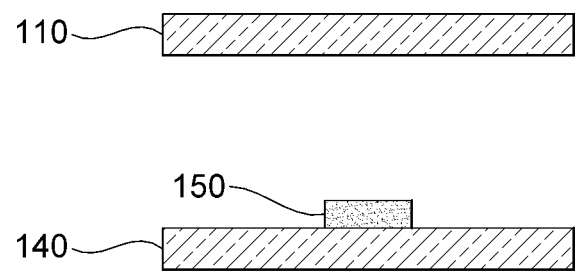

In an alternative embodiment shown in FIG. 3D, the enamel layers on the top substrate 110 can be completely eliminated and the top substrate can be directly bonded to the highly absorbing enamel 150 on the bottom substrate 140.

Figure 3E:
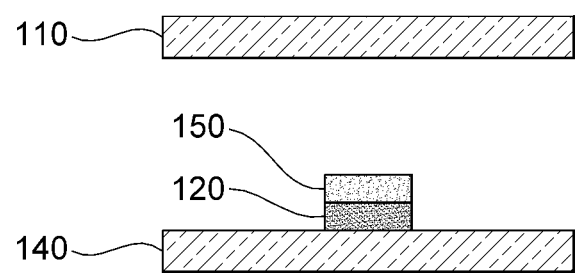

The enamel system on the bottom substrate 140 may optionally further contain a buffer enamel layer 120 directly on the bottom glass substrate 140 and a highly absorbing layer 150 on top of this buffer enamel layer as shown in FIG. 3E.

In an alternative embodiment, pictured in FIG. 4, especially 4A, a thin layer of organic adhesive 270 can be applied to pre-fired assembly 260. Physical pressure 295 can be applied to assist the joining of pre-fired assemblies 230 and 260. Pre-fired assembly 230 includes top substrate 210 and upper absorbing sealant layer 220. Pre-fired assembly 260 includes bottom substrate 240 and lower absorbing sealant layer 250. Bonding between assemblies 230 and 260 is effected by ultrasonically heating the organic adhesive with ultrasonic horn 290, shown in FIG. 4B. Because combustion does not occur, there is no concern about contamination with combustion products.

In an alternative embodiment, as shown in FIGS. 5A and 5B, top assembly 330 is pre-fired as in previous embodiments. Top assembly 330 includes top substrate 310 and upper absorbing sealant layer (enamel) 320. A conductive feedthrough is integrated into bottom assembly 360. In particular, IR absorbing sealant 350 is applied to bottom substrate 340. A conductive trace 370 is applied on top of enamel sealant 350. A second portion of IR absorbing enamel sealant 380 is applied to cover the conductive trace. Assembly 360, before laser sealing, includes substrate 340, enamel sealants 350 and 380, and conductive trace 370 passing between sealants 350 and 380. Assembly 360 is then prefired such that the conductive trace 370 is now feedthrough 370 integral with enamel sealants 350 and 380 and substrate 340. As shown in FIG. 5B, laser 390 is fired through top assembly 330 to fuse enamel 320 with enamel 380. Pressure 395 may be applied to physically join top assembly 330 and bottom assembly 360 together before heating with the laser. It is envisioned that the conductive feedthrough assembly can be on the top plate also. The inventors believe that by sandwiching the conductor trace in between two enamel layers under the seal, the problems associated with: (a) cracking of the glass substrate due to constrained expansion mismatch between the conductive trace and the bottom substrate, and (b) the enhanced corrosion at the conductive trace and the glass substrate both can be eliminated or mitigated.

These feed throughs can be thick film or thin film trace, conductive electrode coatings on glass, ribbon materials or wires. Electrical feedthrough materials can be any metal such as silver, copper, aluminum, nickel-iron, anodized metals for good adhesion to enamel, molybdenum or Indium-Tin-Oxide (ITO) electrode material.

FIG. 6 (6A-6D) shows the sequence of steps to form an integral feedthrough from a different perspective. In FIG. 6A, bottom substrate 440 is printed with a first laser absorbing material 450. Next, in FIG. 6B, a strip of conductive enamel 470 (paste including silver or other suitable material) is printed there over, in a preferred embodiment, at right angles to the layer of laser absorbing material 450. A second layer of laser absorbing material 480 is printed overlapping the first, as seen in FIG. 6C. After laying the top substrate assembly 430 (where the top substrate 410 has previously been coated with laser transparent enamel 420, the step not specifically shown), over the coated bottom substrate 440, which together with items 450, 470 and 480 forms bottom assembly 460, as shown in FIG. 6D, the assembly is laser fired with laser 490 fired through top substrate 410 and laser transparent material 420 to effect fusion and produce a hermetically sealed feedthrough. Pressure 495 may be applied to physically join top assembly 430 and bottom assembly 460 together before heating with the laser.

In the embodiments depicted in FIGS. 3-5, an optional semitransparent absorbing layer (not shown, but corresponding to layer 25 in FIG. 2), may be applied to the top of sealant layer (120, 220, 320). The semitransparent layer together with the lower absorbing sealant layer (150, 250, 350) serves to direct incoming laser IR energy to the interface, ideally to control the point where the maximum heat is developed, and therefore where fusion is focused.

An embodiment of the invention includes, in particular, a process of hermetically sealing a conductive feed through comprising: (a) applying to a first substrate a sealant paste that produces a semitransparent or transparent layer on firing, (b) applying to a second substrate a highly absorbent (pigmented or colored) sealant paste, (c) applying to the second substrate, over the highly absorbent sealant paste, a paste composition including a conductive metal or conductive strip or wire, (d) applying to the second substrate a sealant paste that produces a semitransparent or transparent layer on firing, (e) heating to sinter the respective sealants such that each fuses to its respective substrate, (f) applying to at least one of the sintered enamel compositions a soft enamel composition different from the first and second sealants, (g) positioning the first and second substrates such that the printed soft enamel composition comes acts as a bridge between the first and second substrates and (h) heating to sinter the soft enamel composition such that the first and second sintered enamel compositions are joined together.

In embodiments depicted in FIGS. 2 to 5, although a lap joint between two similar glass plates (top and bottom) is depicted, in another embodiment of the invention various joint arrangements commonly used in welding such as corner joint, tee joint, butt joint, edge joint and different such seal arrangements are envisioned for hermetic sealing of two glass plates.

Figure 7A:
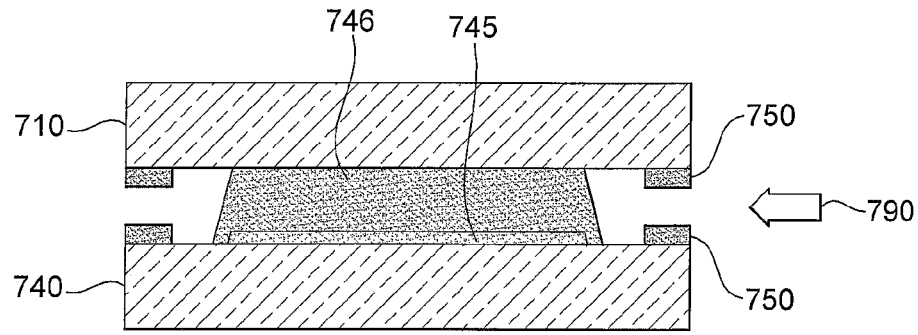
Figure 7B:
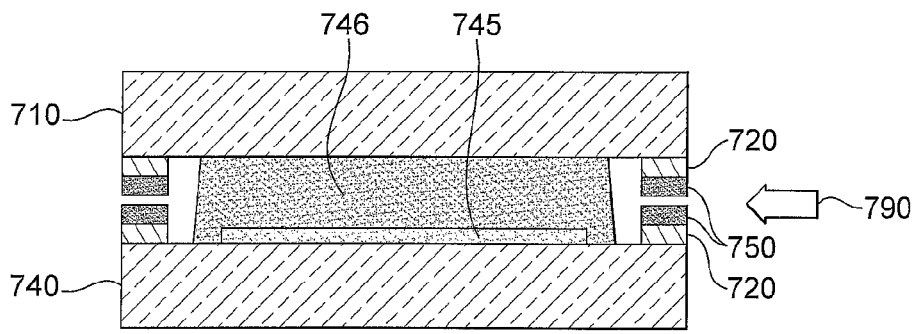

In embodiments depicted in FIGS. 2 to 5 the radiation source (such as laser light) is typically directed through the glass plate (or inorganic substrate) to effectuate heating and fusion of the seal material. However the energy source can be located at any angle relative to the top glass substrate. In one such embodiment of the invention the energy source 790 can be located at the side of the plates as shown in FIGS. 7A and B. In FIG. 7A the light absorbing layer 750 is printed and fired on the glass substrates 710 and 740. The solar cell 745 is placed over the bottom substrate 740, and covered with an optional polymer layer 746. The top substrate assembly—top substrate 710 and light absorbing layer 750—is placed over the bottom substrate assembly—bottom substrate 740 and light absorbing layer 750—and is heated by the laser energy source from the side. The electromagnetic energy from localized source such as laser directly hits the highly absorbing enamel layer and effect the fusing. The absorption behavior and enamel properties determine the depth of the seal. Laser heating the enamel from the slide without going through the top glass substrate helps to selectively heat the seal without heating the solar cell and\or the encapsulating polymer layer inside. Further, in principle both top and bottom substrates can be non transparent inorganic materials such as silicon, ceramics or metals. In the embodiment in FIG. 7B additional buffer enamel layers 720 are printed and fired in between the glass substrate to control heat location, heat distribution. This in turn controls the depth of sealing and helps to minimize or eliminate any cracking at the glass/enamel interface.

Figure 7C:
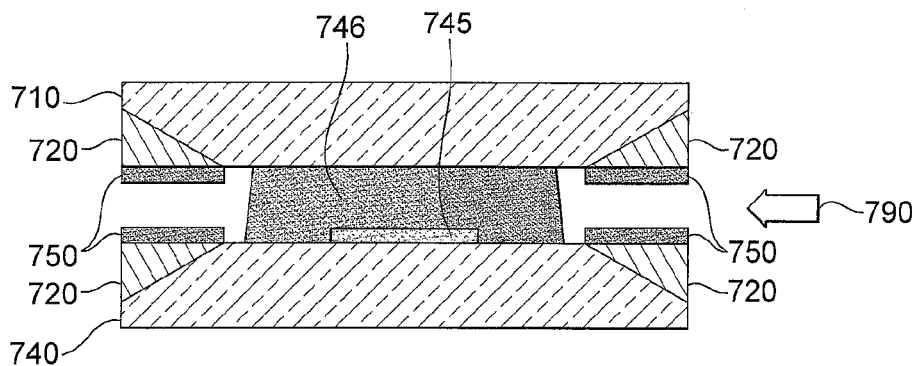

Another embodiment of the invention, as shown in FIG. 7C, both the top glass substrate 710 and the bottom glass substrate 740 are beveled or chamfered. FIG. 7C also depicts a single sided seal (seal only at the right side of the figure), which is an option for all embodiments of the invention. The buffer layer enamel 720 is applied over the chamfered surface. The inventors believe that this angled arrangement of the enamel/glass interface with respect to the fusion line between the top glass substrate and the bottom substrate assembly help to deflect any cracking away from the glass/enamel interface, thus making the entire sealed assembly stronger.

As shown in FIG. 8, another embodiment of the invention involves having the enamel layer 820 fired over the top glass substrate 810 with a recess to engulf another enamel layer 850 fired over the bottom substrate 840. Ultraviolet curable glue 858 is applied over the prefixed enamel layer 850 on the bottom glass substrate. These two prefixed top and bottom glass substrates are assembled with an inter-layer glue 858, and are cured with UV light 890 to effect the seal. In this invention, the enamel on the top of the cured glue layer protects it UV radiation induced degradation of glue, thus extending its lifetime. This arrangement increases long-term reliability, reduces the polymeric thickness of the edge seal, and increase the diffusion length for moisture penetration. The interlayer glue 858 should be, in general, moisture resistant. These are generally can be polymeric glue or can be inorganic-organic glue designed to be moisture resistant. A solar cell 845 may be placed over the bottom substrate 840, and covered with an optional polymer layer 846.

Various polymeric glues include, thermoplastic (vinyl based) or thermosetting, such as epoxy dicyandiamide-curing agent, polyester, hybrid (epoxy polyester), polyurethane, and acrylic and others. Commercially available water resistant glues such as, Super Glue (from The Gorilla Glue Company, Cincinnati, Ohio 45227), Liquid Nails Adhesive (ICI, Strongsville, Ohio 44136), Loctite Ultra or Original (Henkel Corp, Rocky Hill, Conn. 06067) or 3M Marine Adhesive Sealant 5200 (3M Marine, St. Paul, Minn. 55144) can be used.

In another embodiment, heating the first or top glass substrate and second or bottom glass substrate, and unfired (green) enamels applied thereto involves firing with a laser. In a further embodiment, the laser is fired on at least one of the first and second green glass based sealants. In another embodiment, the second green glass based sealant includes a conductive paste. In addition to common thick film metals such as Ag, Cu, and Al, the conductive paste may include at least one transition metal such as Ni or Fe. At least one of the first and second green glass based sealant compositions may include a lead-free Zn—B—Si glass. At least one of the first and second green glass based sealant compositions may lack an absorber such as a pigment. The heating of the substrates may be undertaken simultaneously or sequentially. The soft enamel composition may include a lead-free zinc borosilicate glass frit, and/or an EM-absorber. The green sealants may be dried to form dried green sealants, before heating to sinter. Pressure may be applied to at least one of the substrates. Suitable substrates include glass, conductive oxides coated glass, such as indium tin oxide (ITO) coated, aluminum doped zinc oxide coated, sputtered metals or alloys coated, antireflective coatings, $Si_3N_4$ coatings, and combinations thereof.

The substrates may be the same or different, and may be selected from among glass, conductive oxides, coated indium tin oxide, aluminum doped zinc oxide glass, metal, and ceramics.

The inventors have learned that a variety of parameters that must be controlled to ensure successful formation of a hermetic seal or feedthrough. Such parameters include temperature to which the substrates and enamels are heated, temperature homogeneity within and across the substrates and enamels, and the time of firing. Relative to the compositions, important factors include: the formulation of the paste glass(es); inorganic additives, thermal conductivity, thermal diffusivity, thermal expansion and flow temperatures of the enamels, the rheology of the paste(s); the cross-section of a printed paste or conductive trace (a rectangular cross-section being preferred); the absorbance of each layer (substrate(s), transparent enamels, semi transparent enamels, absorbing enamels, conductive paste(s)); the power input of the firing device (laser, furnace, xenon lamp, etc); the size of the laser spot fired into the pastes; the homogeneity of the laser spot fired into the pastes; the scan rate of the laser (or other firing device), to name a few.

The inventors note that the requirements for the glass compositions used in the sealing enamel are not very demanding other than controlling the absorbers. The glass frits do need to have low solubilities so that they do not slowly dissolve away or degrade over the 25 year life span (or longer) of a solar module. Second, they need to have an appropriate softening point so that they can be bonded to the substrate materials with the particular localized heating technique being used. For sealing soda-lime glass substrates, the glass fits used in the enamels should have a glass softening point less than about 750° C. The upper temperature is limited by the fact that soda-lime glass substrate will start to undergo excessive flow. With substrate materials such as stainless steel and ceramics the softening point limit can be higher. It is to be noted that without selective sealing techniques where the seal material is preferentially heated to the higher temperatures compared to the substrates, even for soda lime glass substrates, the softening point of the frit can be up to about 850° C., or even up to about 900° C. However the glass systems quoted in this invention are preferred embodiments considering other properties such as bonding to substrates.

To form the seals herein, one or more layers of laser-transparent or laser-semi transparent, laser-absorbing enamel pastes are involved. The enamel paste includes glass frits, inorganic additives, and optionally an organic vehicle. The laser-absorbing paste may include an EM-absorber such as an inorganic pigment or have the pigments as part of the glass structure, while the laser-transparent paste lacks pigment or such absorbers in the glass, and the semi transparent paste includes absorbers at a concentration between those for transparent glass and highly absorbing glass. A conductive enamel includes a metal such as silver and/or aluminum, as well as a glass frit. An organic vehicle is optional. The aforementioned constituents are detailed hereinbelow.

Glass Component.

The glass component of the seals herein is fired (heated to fusion) in order to effectuate physical bonding between two generally flat substrates, which may be glass plates or glass plate (for top) and a metal plate (for bottom) The glass component may be part of a paste as noted previously. The pastes useful herein comprise about 0.1 to about 95 wt %, preferably 5 to about 85 wt % of a glass component, most preferably 10 to 80 wt % of a glass component. The glass component comprises, prior to firing, one or more glass compositions. Each glass composition comprises oxide frits including, in one embodiment, $Bi_2O_3$, ZnO, and $B_2O_3$. In another embodiment $Bi_2O_3$, $B_2O_3$ and $SiO_2$. In yet another embodiment $Bi_2O_3$, ZnO, $B_2O_3$ and $SiO_2$. In another embodiment, the glass composition comprises an alkali oxide, $TiO_2$, and $SiO_2$. In yet another embodiment, the glass composition comprises PbO. In particular, in various embodiments of the present invention, glass compositions may be found in Tables 1-6. In formulating the pastes, the glass frits typically have particle sizes of about 0.1 to about 30 microns, preferably 1-20 microns, more preferably 2-15 microns, most preferably 3-10 microns although other particle sizes may be used as known in the art.

The sealing glass materials of this invention can be applied by a number of techniques such as screen printing, extrusion of pastes, ink jet printing (for thin layers), pad printing techniques, and tape casting process. The inventors have discovered that the inventive seal materials can be cast into tape form by making green tapes from casting a tape slurry whose organics typically contain a thermoplastic polymer such as PVB resin, a plasticizer, solvent and optionally a dispersant as specified in commonly owned U.S. Pat. No. 7,547,369, which is fully incorporated herein by reference.

The glass compositions are formed in a known manner as, for example, blending the known starting materials and melting at a temperature of about 900° C. to 1450° C. for sufficient time, typically an hour, depending on the batch size to form a molten glass having the desired composition. The molten glass formed can then be suddenly cooled, e.g., water quenched, in a known manner to form a frit. The frit can then be ground using conventional milling techniques to a particle size, generally in the range of 0.1 to 30 microns depending on the seal glass application technique. For a paste deposition process the desired particle size is in the range 1 to 20 microns, preferably 2 to 15 microns, more preferably between 3 and 10 microns. This component comprises the disclosed glass frit compositions.

Useful glass systems herein include, for example, a colorless (or slightly colored) bismuth glass (Bi—Zn—B—Si oxides) or (Bi—B—Si oxides) which has in general a lower melt point than a colored bismuth glass (Bi—Zn—B and at least one of Co, Cu, Cr, Mn, Ni, Fe oxides) as well as (Bi—B—Si and at least one of Co, Cu, Cr, Mn, Ni, Fe oxides). The inventors herein have found that CuO, $Fe_2O_3$, $Co_2O_3$, $Cr_2O_3$, MnO and alkali oxides, especially $K_2O$, small amounts of $SiO_2$ and $Al_2O_3$ can be used to control flow, crystallization and light absorption characteristics of sealing glass compositions. Although additions of PbO and $V_2O_5$ are not preferred for environmental reasons, these oxides can be added to the inventive glasses to control flow characteristics. Similarly the oxides that generally promote wetting such as $Ta_2O_5$, $WO_3$, $MoO_3$, and SnO can also be added to the inventive glasses.

Similarly the inventors have found that glasses containing $Co_2O_3$, $Fe_2O_3$, CuO, and MnO promote bonding to the soda lime silica glass substrates. Useful glasses in the invention include those in Table 1. In the table below, for each oxide with an entry of "no intentional addition," the preferred embodiment is "devoid of all."

TABLE 1

Broad ranges for individual oxides to be used in Bi—Zn—B—Si oxides sealing glass frits.

| Oxide (Mole %) | I | II | III | IV | V |
|---|---|---|---|---|---|
| $Bi_2O_3$ | 25-65 | 30-60 | 32-55 | 35-50 | 37-45 |
| ZnO | 3-60 | 10-50 | 15-45 | 20-40 | 30-40 |
| $B_2O_3$ | 4-65 | 7-60 | 10-50 | 15-40 | 18-35 |
| $SiO_2 + Al_2O_3$ | 0-50 | 0-30 | 0-20 | 0.1-10 | 0.1-5 |
| $TiO_2 + ZrO_2$ | 0-20 | 0-10 | 0-5 | 0.1-5 | 0.1-5 |
| $CeO_2$ | No intentional additions | | | | |
| Refractory oxides | No intentional additions | | | | |
| PbO and CdO | No intentional additions | | | | |

TABLE 2

Ranges for individual additional oxides to be used in sealing glass frits in minor amounts.

| Alternative Oxide Ranges (Mole %) | VI | VII | VIII | IX | X | XI |
|---|---|---|---|---|---|---|
| $K_2O$ | 0-15 | 0.1-10 | 0.5-8 | 1-7 | 1.5-5 | 2-4 |
| $Li_2O$ | 0-15 | 0.1-10 | 1-9.5 | 2-9 | 3-8 | 4-8 |
| $La_2O_3$ | 0-15 | 0.1-10 | 1-9 | 2.5-7 | 3-6 | 3.5-5 |
| $Fe_2O_3$ | 0-35 | 0.1-10 | 0.5-8 | 1-7 | 2-6 | 4-5.5 |
| CuO | 0-35 | 0.1-10 | 2-9.5 | 3-9 | 5-8.5 | 6-8.5 |
| $Co_2O_3$ | 0-35 | 0.1-10 | 2-9.75 | 4-9.5 | 6-9 | 7.5-9 |
| MnO | 0-35 | 0.1-10 | 1.5-9 | 2-8 | 4-7 | 4-7 |
| NiO | 0-15 | 0.1-10 | 1.5-9 | 2-8 | 4-7 | 4-7 |
| ($Ta_2O_5$ + $P_2O_5$ + $WO_3$ + $MoO_3$ + SnO) | 0-10 | 0-8 | 0-6 | 0.1-5 | 0.1-4 | 0.1-4 |
| $F_2$ | 0-15 | 0-10 | 0-8 | 1-6 | 2-6 | 2-6 |

Alternative ranges for individual additional oxides in Table 2 include, for CuO, $Fe_2O_3$, $Co_2O_3$, and MnO, in mol %: 1.5-9, 2-8 and 4-7. Alternate ranges for $La_2O_3$ include 0.5-8, 2-6 and 1-6 mol %.

Oxides in table 2, including the alternatives in the preceding paragraph, can be used in any amount disclosed in any column together with oxides from table 1. Amounts from different columns in table 2 can be used with amounts of oxides from any column in table 1.

It is to be noted that a portion of these glass oxides such as $Bi_2O_3$, ZnO, CuO, $Fe_2O_3$, $Co_2O_3$, MnO, $SiO_2$ and $Al_2O_3$ or combinations thereof, can be included as ceramic oxide additives in the seal materials to obtain the final overall glass compositions envisioned here.

As mentioned previously multiple glasses, preferably glass mixtures of two or three frits can be used to control the overall properties of the seal. If a second glass composition is used, the proportions of the glass compositions can be varied to control the extent of paste interaction with substrates, flow and crystallization characteristics of the seal and hence the resultant seal properties. For example, within the glass component, the first and second glass compositions may be present in a weight ratio of about 1:20 to about 20:1, and preferably about 1:5 to about 5:1. The glass component preferably contains no lead or oxides of lead, and no cadmium or oxides of cadmium. However, in certain embodiments where the properties of PbO cannot be duplicated, such embodiments advantageously comprise PbO. Further the second or third glass can be another bismuth glass from Tables 1-3, or a zinc glass (Table 4) or alkali titanium silicate glass (Table 5) or a lead glass (Table 6).

TABLE 3

Broad ranges for individual oxides to be used in Bi—B—Si oxide sealing glass frits

| | Glass Composition | | |
|---|---|---|---|
| Oxide Mole % | I | II | III |
| $Bi_2O_3$ | 5-85 | 10-75 | 12-50 |
| $B_2O_3 + SiO_2$ | 5-75 | 15-75 | 34-71 |
| $Li_2O + Na_2O + K_2O$ | 0-40 | 5-30 | 10-30 |
| ZnO | 0-55 | 0-20 | 0-12 |
| $TiO_2 + ZrO_2$ | 0-20 | 0-10 | 1-6 |

Oxides in table 2, including the alternatives in the paragraph following Table 2, can be used in any amount disclosed in any column together with oxides from table 3. Amounts from different columns in tables 2 can be used with amounts of oxides from any column in table 3.

TABLE 4

Oxide frit ingredients for zinc based additive glasses in mole percent.

| | Glass Composition | | |
|---|---|---|---|
| Ingredient [Mole %] | IV | V | VI |
| ZnO | 5-65 | 7-50 | 10-32 |
| $SiO_2$ | 10-65 | 20-60 | 22-58 |
| $B_2O_3$ | 5-55 | 7-35 | 10-25 |

TABLE 5

Oxide frit ingredients for alkali-titanium-silicate additive glasses in mole percent.

| | Glass Composition | | |
|---|---|---|---|
| Ingredient [Mole %] | VII | VIII | IX |
| $Li_2O + Na_2O + K_2O$ | 5-55 | 15-50 | 30-40 |
| $TiO_2$ | 0-26 | 10-26 | 15-22 |
| $B_2O_3 + SiO_2$ | 5-75 | 25-70 | 30-52 |
| $V_2O_5 + Sb_2O_5 + P_2O_5$ | 0-30 | 0.25-25 | 5-25 |
| $MgO + CaO + BaO + SrO$ | 0-20 | 0-15 | 0-10 |
| F | 0-20 | 0-15 | 5-13 |

TABLE 6

Oxide frit ingredients for lead based additive glasses in mole percent.

| | Glass Composition | | |
|---|---|---|---|
| Ingredient [Mole %] | X | XI | XII |
| PbO | 15-75 | 25-66 | 50-65 |
| $B_2O_3 + SiO_2$ | 5-75 | 20-55 | 24-45 |
| ZnO | 0-55 | 0.1-35 | 0.1-25 |

TABLE 6-continued

Oxide frit ingredients for lead based additive glasses in mole percent.

| | Glass Composition | | |
|---|---|---|---|
| Ingredient [Mole %] | X | XI | XII |
| $Li_2O + Na_2O + K_2O$ | 0-40 | 0-30 | 0-10 |
| $TiO_2 + ZrO_2$ | 0-20 | 0-10 | 0.1-5 |

Oxides in table 2, including the alternatives in the paragraph following Table 2, can be used in any amount disclosed in any column together with oxides from tables 4-6. Amounts from different columns in table 2 can be used with amounts of oxides from any column in tables 4-6.

Other additives, such as ceramic powders, can be used to tailor the expansion (CTE) of composite glass compositions. The inventive glasses have CTEs in the range of about $85\text{-}130\times10^{-7}/°$ C. Ceramic powders such as cordierite, Beta-ecryptite, zircon, crystalline silica (such as quartz), alumina and zirconia have CTEs in the range of $0\text{-}100\times10^{-7}/°$ C. Hence, glasses with CTEs in the overall range of $30\text{-}130\times10^{-7}/°$ C. can be formulated. Such are used only to the extent that they do not increase the melt point of a frit formed therewith beyond 550° C., more preferably 500° C.

Other additives, such as $Al_2O_3$, AlN, SiC, $Si_3N_4$, silicon, BN can be used to tailor the thermal conductivity and thermal diffusivity of the sealing glass materials of these inventive glass materials.

In formulating the pastes, the glass fits typically have particle sizes of about 0.5 to about 10 microns, although other particle sizes may be used as known in the art.

Metal Component.

In a feedthrough, largely because of concerns with oxidation (during firing or during service life), noble metals such as Ag, Au (if cost is not a concern and preventing oxidation is a paramount requirement) are typically used. However, if care is taken during firing (firing in an inert or low-oxygen atmosphere, or extremely fast firing as with a laser), non-noble metals such as Cu, Ni, Al may be used. A feedthrough metal component typically comprises silver, however, aluminum or copper may be used. The protection against weathering and oxidation afforded by the enamel based hermetic seals of the invention effectively prevents degradation of the contact or circuit. In fact electrical feed through materials can be any metal such as silver, copper, aluminum, nickel-iron, anodized metals for good adhesion to enamel, molybdenum, or Indium-Tin-Oxide (ITO) electrode material. Feedthroughs can be thick film or thin film trace, conductive electrode coatings on glass, ribbon materials or wires.

The metal components may come in any suitable form, including powder, alloys, salts, organometallics, oxides, and are also provided in the form of a paste, together with glass and optionally an organic vehicle to form thick film pastes. The metal particles used in the paste may be spherical, flaked, or provided in a colloidal suspension, and combinations of the foregoing may be used. In formulating the pastes, the metal powders typically have particle sizes of about 0.1 to about 40 microns, preferably less than 10 microns. For example the paste may comprise about 80 to about 99 wt % spherical metal particles or alternatively about 75 to about 90 wt % metal particles and about 1 to about 10 wt % metal flakes. Alternatively the paste may comprise about 75 to about 90 wt % metal flakes and about 1 to about 10 wt % of colloidal metal, or about 60 to about 95 wt % of metal powder or metal flakes and about 0.1 to about 20 wt % of colloidal metal. Suitable commercial examples of silver particles are available from Ferro Corporation, Cleveland, Ohio. Copper and other base- or non-noble metals may be used in solar cell contacts or other electric or electronic devices protected by the seals disclosed herein. It is believed that the threat to such metals represented by oxidative and/or atmospheric degradation is effectively eliminated by the seals disclosed herein.

Feedthroughs can be thick film or thin film trace, conductive electrode coatings on glass, ribbon materials or wires. For thin film traces the electrodes can be sputtered or evaporated or CVD coated or electroplated from a plating solution or ink jet printed.

Organic Vehicle.

The enamel sealants of the invention do not require an organic vehicle and in certain cases, it is preferred to avoid their use. However, alternate embodiments of the invention can involve the use of an organic vehicle or carrier which is typically a solution of a resin dissolved in a solvent and, frequently, a solvent solution containing both resin and a thixotropic agent. The organics portion of the pastes comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and/or wetting agent is also envisioned. Ethyl cellulose is a commonly used resin. However, resins such as ethyl hydroxyethyl cellulose, wood rosin, mixtures of ethyl cellulose and phenolic resins, polymethacrylates of lower alcohols and the monobutyl ether of ethylene glycol monoacetate can also be used. Solvents having boiling points (1 atm) from about 130° C. to about 350° C. are suitable. Widely used solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanolt (2,2,4-trimethyl-1,3-pentanediol monoisobutyrate), as well as other alcohol esters, kerosene, and dibutyl phthalate.

EXEMPLARY EMBODIMENTS OF THE INVENTION

The examples below involve laser sealing together two substrates, primarily 76×76× The examples below involve laser sealing together two substrates, primarily 76×76×1.6 mm soda-lime glass coupons. The glasses and dopants were composed of metal oxides, but are abbreviated simply as the elemental symbols. Two printing techniques were utilized for the given examples, screen printing and syringe deposition, depositing edge barriers in the shape of square frames or 4-square patterns. The width of the barriers was varied from 0.5-3.5 mm. Wider barriers could also be used but would simply require more deposition material without any significant improvements of barrier properties. Note that the use of opaque enamels on the bottom substrate prevents laser penetration to the bottom substrate interface, preventing any direct perturbation of the well annealed enamel-bottom substrate interface obtained from the preglaze fire.

The glass frits were either undoped to provide an essentially non-absorbing buffer layer, lightly doped (approximately 0.25-5.0 mole % of an absorbing metal ion) to provide a semi-transparent layer, or heavily doped (approximately 6.0-30.0 mole %) to provide a layer that was opaque to the radiation being used for sealing. Undoped glasses were also used to form opaque enamel layers by incorporating pigments into the paste formulation, and likewise were used to make semi-transparent layers by using low levels of pigment additions. Also note that since the absorption property is most important and is approximately a function of dopant level times the enamel thickness, different doping levels can be accommodated for the semi-transparent enamel by adjusting the thickness of the enamel layer.

Example (A)

Double enamel laser seal with low-temperature glass, Trial TC2141-30A4. The top substrate was screen printed with paste 7, comprising an undoped Pb borate glass and 0.5V % Ferro pigment V-792 (based on solids content). It was preglaze fired at 318° C., yielding a semi-transparent 1 mm wide seal, height 40 microns. The bottom substrate was screen printed with paste 8, comprising an undoped Pb borate glass and 20V % Ferro pigment V-792. It was preglaze fired at 400° C. to produce an opaque 1 mm wide opaque seal, height 40 microns. The two substrates were clamped enamel-to-enamel and laser sealed (100 W, 500 inches/minute scan rate). The result was a strong seal.

Example (B1)

Double enamel laser seal with buffer layers, with medium-temperature glass, Trial TC2141-27B19. The top substrate received a first screen print of paste 4 (buffer layer), comprising a ZnBi borate glass containing no absorber ions. A second screen print was made on top of the first with paste 5, comprising a lightly Mn-doped ZnBi borate glass. The dried sample was preglaze fired at 440° C. to produce a semi-transparent 1 mm wide seal, height 60 microns.

The bottom substrate was first screen printed with paste 4 (buffer layer). A second screen print was made on top of first with paste 6, comprising a heavily Mn-doped ZnBi borate glass. It was preglaze fired at 470° C. to produce an opaque 1 mm wide seal, height 60 microns. The two substrates were clamped enamel-to-enamel and laser sealed (100 W slightly defocused beam, 300 inches/minute scan rate). The result was a strong, durable seal.

Example (B2)

Double enamel laser seal without buffer layers with medium-temperature glass, Trial TC2141-49A12. The top substrate was screen printed with paste 11 as a 2" square frame pattern, the paste comprising of a lightly Cu-doped ZnBi borate glass and modifiers. It was preglaze fired at 440° C. to produce a semi-transparent 3 mm wide seal, height 25 microns. The bottom substrate was syringe deposited paste 12 as a 2" square frame pattern, the paste comprising heavily Mn-doped ZnBi borate glass plus modifiers. It was preglaze fired at 470° C. to give an opaque 2.5 mm wide seal, height 180 microns. The two substrates were clamped enamel-to-enamel and laser sealed (780 W, speed=200 ipm). The result was a strong, durable seal that passed a dye-leak hermeticity test. Microscopy showed seal areas without any apparent fractures, and the enamel-to-bottom substrate interface looked especially ideal.

Example (C)

Double enamel laser seal with high-temperature glass: Trials TC2141-27A8 and TC2141-27A9. The top substrate was first screen printed with a buffer layer with paste 3, comprising of an undoped alkali borosilicate glass, and a second screen print on top of first with paste 2, comprising of an undoped alkali borosilicate glass and Ferro pigment V792. It was preglaze fired at 575° C. to produce a semi-transparent 1 mm wide seal, height 60 microns. The bottom substrate was first screen printed with paste 3 (buffer layer), and then with paste 1, comprising an alkali borosilicate glass and 30V % Ferro pigment K393-2. It was preglaze fired at 575° C. to produce an opaque 1 mm wide seal, height 60 microns. The two substrates were clamped enamel-to-enamel and laser sealed (100 W, 300 inches/minute scan rate). Both trials resulted in strong seals.

Example (D)

Single enamel laser seal with medium-temperature glass, Trial TC2141-49A23. The top substrate was a blank glass substrate with no enamel. The bottom substrate had paste 10 syringe deposited in a 2" square frame pattern, the paste comprising of heavily Mn-doped ZnBi borate glass and modifiers. It was preglazed fired at 470° C., and then lightly sanded to provide a flat top over >50% of the width, yielding an opaque 2.5 mm wide seal, height 180 microns. The two substrates were clamped enamel-to-substrate and laser sealed (950 W, speed=240 inches/minute). The result was a strong seal. It passed initial dye-leak hermeticity tests and microscopy showed the bond area to be without fractures except at corners that got double lased.

Example (E1)

Formation of enameled coupon with conductive feed-throughs, Trial TC2141-32A1. Paste 10 was screen printed in a 4-square pattern, and then dried at 150° C., the paste comprising a heavily Mn-doped ZnBi borate glass. Ag paste 26060M (Ferro Corporation) was then screen printed as a pattern of two 2×64 mm lanes crossing the 4-square pattern. After drying, a third screen print using paste 10 was deposited as a 4-square pattern superimposed on the first print. The coupon was preglaze fired at 470° C. The result was a low resistance line from end-to-end of the silver path, with a resistance of 39 milli-ohms. This experiment showed that a conductive path could be formed at this temperature and that the enamels did not disrupt its conductivity.

Example (E2)

Sealed coupons containing conductive feed-throughs, Trial TC2141-33A15. The top substrate was screen printed with paste 9, the paste comprising a lightly Fe-doped ZnBi borate glass. It was preglaze fired at 440° C. Coupon TC2141-32A1 (example E1) was used as the bottom substrate. The two substrates were clamped enamel-to-enamel and laser sealed (100 W). The result was a good bond, and the silver paths were not affected by the laser sealing process, maintaining their 39 milli-ohm resistance.

TABLE 8

Compositions of Ferro experimental sealing glasses.

| Mole % | Glass 1 | Glass 2 | Glass 3 | Glass 4 | Glass 5 | Glass 6 |
|---|---|---|---|---|---|---|
| ZnO | 32 | 30 | 30 | 18 | 29 | 1 |
| PbO | | | | | | 66 |
| $Bi_2O_3$ | 49 | 47 | 47 | 35 | 48 | 3 |
| $B_2O_3$ | 19 | 17 | 18 | 14 | 18 | 26 |
| $Al_2O_3$ | | 1 | 1 | 1 | 2 | 1 |
| $SiO_2$ | | 2 | 2 | 2 | 3 | 1 |
| $K_2O$ | | 1 | | | | |
| MnO | | 2 | | 30 | | |
| CuO | | | 2 | | | |
| $Fe_2O_3$ | | | | | 0.4 | |
| $Li_2O$ | | | | | | 1 |
| BaO | | | | | | 1 |

The paste compositions from the examples are given in Table 7. The ingredients were mixed in a Dac mixer, processed through a 3-roll mill, remixed in a Dac mixer, treated with an ultrasonic probe, and finally remixed in the Dac mixer. The compositions of the Ferro experimental glasses are given in Table 8. The Ferro products are commercially available from Ferro Corporation, Cleveland, Ohio. The Solsperse® products are commercially available from Lubrizol Corporation, Wicklife, Ohio. The Byk® products are commercially available from Byk Chemie, GmbH, Wesel, Germany.

Each numerical range disclosed herein that is bounded by zero, has, as an alternative embodiment, a lower bound of 0.1% instead of zero. The term "comprising" provides support for "consisting essentially of" and "consisting of" It is envisioned that an individual numerical value for a parameter, temperature, weight, percentage, etc., disclosed herein in any form, such as presented in a table, provides support for the use of such value as the endpoint of a range. A range may be bounded by two such values. In a single embodiment, more than one glass composition can be used, and compositions comprising amounts from different columns among the tables are also envisioned.

Certain embodiments of the invention are envisioned where at least some percentages, temperatures, times, and ranges of other values are preceded by the modifier "about." "Comprising" is intended to provide support for "consisting of" and "consisting essentially of." Where ranges in the claims of this provisional application do not find explicit support in the specification, it is intended that such claims provide their own disclosure as support for claims or teach-

TABLE 7

Compositions of the non-commercial frits and pastes covered in the examples.

| Paste No. | Glass No. | Glass Dopant | Dopant Mole % | Frit Wt % | Pigment Wt % | EG0225 Modifier Wt % | C-31 Vehicle Wt % | Solsperse 38500 Dispersant Wt % | Byk 410 Thixotrope Wt % | Pigment ID |
|---|---|---|---|---|---|---|---|---|---|---|
| 1 | S46/6 | | | 43 | 37 | | 19 | 2 | | K393-2 |
| 2 | S46/6 | | | 74 | 0.8 | | 24 | 1 | 0.2 | V792 |
| 3 | S46/6 | | | 75 | | | 24 | 1 | 0.2 | |
| 4 | 1 | | | 89 | | | 11 | .5 | 0.2 | |
| 5 | 2 | MnO | 1 | 89 | | | 11 | .5 | 0.2 | |
| 6 | 4 | MnO | 20 | 89 | | | 11 | .5 | 0.2 | |
| 7 | 6 | | | 88 | 0.3 | | 11 | .5 | 0.2 | V792 |
| 8 | 6 | | | 74 | 14 | | 11 | .5 | 0.2 | V792 |
| 9 | 5 | Fe2O3 | 0.3 | 87 | | 2 | 11 | .5 | 0.2 | |
| 10 | 4 | MnO | 20 | 87 | | 2 | 11 | .5 | 0.2 | |
| 11 | 3 | CuO | 1 | 85 | | 3 | 11 | .5 | 0.2 | |
| 12 | 4 | MnO | 5 | 87 | | 2 | 11 | .5 | 0.2 | |

Glass S46/6, Modifier EG0225, Vehicle C-31, Pigment K393-2, and Pigment V792 are commercial Ferro Corporation products.
Solsperse dispersants are marketed by Lubrizol Corporation.
Byk additives are products of Byk Chemie GMBH.

ings in a later filed non-provisional application. All compositional percentages are by weight and are given for a blend prior to firing. Numerical ranges of oxides or other ingredients that are bounded by zero on the lower end (for example, 0-10 wt % $Cu_2O$) are intended to provide support for the concept "up to [the upper limit]," for example "up to 10 wt % SnO" as well as a positive recitation that the ingredient in question is present in an amount that does not exceed the upper limit. An example of the latter is "comprises SnO, provided the amount does not exceed 10 wt %." A recitation such as "8-25 wt % ($Li_2O+Na_2O+K_2O$)" means that any or all of $Li_2O$, $Na_2O$ and/or $K_2O$ may be present in an amount of 8-25 wt % of the composition.

All ranges disclosed herein are to be understood to encompass the beginning and ending range values and any and all subranges therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1.0 to 2.7, 3.3 to 8.9, 5.7 to 10, etc. In other words, ranges are used as a shorthand for describing each and every value that is within the range. Any value within the range can be selected as a terminus of a subrange within the range.

The invention claimed is:

1. A method of forming a hermetic seal between two inorganic substrates comprising:
   a. applying a first glass-based sealant to a first inorganic substrate,
   b. applying a second glass-based sealant to a second inorganic substrate,
   c. applying an enamel composition to the first sealant,
   d. sintering the first and second sealants such that the first sealant fuses to the first substrate and the second sealant fuses to the second substrate,
   e. positioning the first and second substrates such that the enamel composition is situated between the sintered first and second sealants, and
   f. heating the enamel composition to thereby form a hermetic seal between the first and second substrates.

2. The method of claim 1, further comprising applying a composition including a conductive metal across at least one of the first and second sealants so as to form a conductive feed through in the hermetic seal wherein:
   at least one of the first and second sealants is substantially free of electromagnetic energy absorbers.

3. The method of claim 2, wherein the first sealant is substantially free of electromagnetic energy absorbers.

4. The method of claim 3, wherein the second sealant is substantially free of electromagnetic energy absorbers.

5. The method of claim 2, wherein the enamel composition comprises an electromagnetic energy absorber, and the enamel composition is heated by electromagnetic energy.

6. The method of claim 5, wherein the enamel composition absorbs at least 40% of the incident electromagnetic energy.

7. The method of claim 5, wherein the electromagnetic energy is directed through at least one of the first and second sealants that is substantially free of electromagnetic energy absorbers to thereby heat the enamel composition.

8. The method of claim 7, wherein at least one of the first and second sealants through which the electromagnetic energy is directed to heat the enamel composition absorbs less than 20% of the incident electromagnetic energy.

9. The method of claim 2, wherein sintering the first sealant also causes the enamel composition to sinter.

10. The method of claim 2, wherein the enamel composition is applied to the first sealant after the first sealant is sintered.

11. The method of claim 1, further comprising applying an enamel trace including a conductor, across the first sealant and positioned between the first sealant and the enamel composition,
   wherein sintering the first sealant causes the enamel trace and the enamel composition to sinter, thereby hermetically sealing a conductive feed through between the sintered first sealant and the sintered enamel composition.

12. The method of claim 11, wherein:
   the first sealant is applied parallel to an edge of the first substrate,
   the enamel composition is applied parallel to the edge of the first substrate and substantially over the first sealant, and
   the enamel trace including a conductor contacts the first substrate in the area adjacent to both edges of the first sealant.

13. The method of claim 1, wherein the enamel composition is heated with electromagnetic energy and the enamel composition absorbs at least 40% of the incident electromagnetic energy.

14. The method of claim 13, wherein at least one of the first and second sealants do not absorb greater than 20% of the incident electromagnetic energy.

15. The method of claim 13, wherein a conductive feed through is incorporated in the hermetic seal.

16. The method of claim 15, wherein the conductive feed through comprises an electrode of a photovoltaic device.

17. The method of claim 13, wherein one of the first and second substrates includes an indium tin oxide coating as a conductive feed through the hermetic seal.

* * * * *